US012486095B2

(12) United States Patent
Minemura et al.

(10) Patent No.: US 12,486,095 B2
(45) Date of Patent: Dec. 2, 2025

(54) ELECTRONIC DEVICE AND PACKING STRUCTURE

(71) Applicant: SEIKO EPSON CORPORATION, Tokyo (JP)

(72) Inventors: Hidefumi Minemura, Shiojiri (JP); Haruki Miyasaka, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 314 days.

(21) Appl. No.: 18/179,997

(22) Filed: Mar. 7, 2023

(65) Prior Publication Data

US 2023/0286725 A1 Sep. 14, 2023

(30) Foreign Application Priority Data

Mar. 8, 2022 (JP) ................................ 2022-035027

(51) Int. Cl.

*B65D 81/113* (2006.01)
*B65D 77/02* (2006.01)
*B65D 81/05* (2006.01)
*B65D 85/68* (2006.01)
*H05K 5/02* (2006.01)

(52) U.S. Cl.

CPC ............ *B65D 81/113* (2013.01); *B65D 77/02* (2013.01); *B65D 81/057* (2013.01); *B65D 85/68* (2013.01); *H05K 5/0217* (2013.01); *H05K 5/0234* (2013.01); *B65D 2585/689* (2013.01)

(58) Field of Classification Search

CPC .... B65D 81/113; B65D 77/02; B65D 81/057; B65D 85/68; B65D 2585/689; H05K 5/0217; H05K 5/0234
USPC ................................ 206/523, 591, 592, 594
See application file for complete search history.

(56) References Cited

U.S. PATENT DOCUMENTS 5,131,539 A * 7/1992 Karita .................. B41J 2/17533 D18/56
2006/0191806 A1* 8/2006 Takata ................. B41J 2/17533 206/223
2012/0305552 A1 12/2012 Tsuyuki et al.

FOREIGN PATENT DOCUMENTS

JP 2012-246038 A 12/2012

* cited by examiner

*Primary Examiner* — Jacob K Ackun
(74) *Attorney, Agent, or Firm* — WORKMAN NYDEGGER

(57) ABSTRACT

A packing structure is a packing structure including an electronic device including a device main body, an accommodation bag accommodating the device main body, a shock absorbing member coming into contact with ribs formed at a bottom surface of the device main body via the accommodation bag, and a packing box accommodating the device main body via the accommodation bag and the shock absorbing member, in which the shock absorbing member is corrugated cardboard having cores extending in parallel with one side of a bottom surface of the packing box, and the ribs extend in a direction intersecting a first direction in which the cores extend.

9 Claims, 8 Drawing Sheets

ELECTRONIC DEVICE AND PACKING STRUCTURE

The present application is based on, and claims priority from JP Application Serial Number 2022-035027, filed Mar. 8, 2022, the disclosure of which is hereby incorporated by reference herein in its entirety.

BACKGROUND

1. Technical Field

The present disclosure relates to an electronic device including a device main body. In addition, the present disclosure relates to a packing structure including an electronic device, an accommodation bag, a shock absorbing member, and a packing box.

2. Related Art

An example of a packing structure of an electronic device is disclosed in JP-A-2012-246038. The packing structure disclosed in JP-A-2012-246038 is a container in which an accommodation space capable of accommodating a packed object is formed, and includes a box-shaped outer container having a passing port through which the packed object can pass, a bag portion capable of accommodating the packed object, an opening which is formed in the bag portion and through which the packed object can pass, and a handle portion which is formed in the bag portion and can be held by a user. In addition, a lower cushion is disposed on the bottom surface of the packed object.

In a case where the lower cushion disclosed in JP-A-2012-246038 is constituted by a shock absorbing member having cores, for example, corrugated cardboard, the bottom surface of the packed object is strongly pressed against the core. Here, in the electronic device, a plurality of ribs may be formed to ensure the strength of the bottom surface. In such a structure in which the ribs are pressed against the cores of the shock absorbing member, an accommodation bag may be torn due to shaking of a packed object during transportation of the ribs and the cores in a state where the accommodation bag is sandwiched between the ribs and the cores.

Note that, since such a disadvantage occurs due to the accommodation bag being sandwiched between the ribs and the core, there is a concern that the above-described disadvantage may be caused even when the ribs are formed somewhere other than a bottom surface.

SUMMARY

In order to solve the problem described above, an electronic device of the present disclosure is an electronic device including a rib provided at an outer surface of a device main body, the rib being configured to come into contact, via an accommodation bag, with a packing material having a core, wherein the rib is configured to extend in a direction intersecting a first direction in which the core extends.

Further, a packing structure according to the present disclosure is a packing structure including an electronic device including a device main body, an accommodation bag configured to accommodate the device main body, a shock absorbing member configured to come into contact, via the accommodation bag, with a rib formed at a bottom surface of the device main body, and a packing box configured to accommodate the device main body via the accommodation bag and the shock absorbing member, wherein the shock absorbing member is corrugated cardboard having a core extending in parallel with one side of a bottom surface of the packing box, and the rib is configured to extend in a direction intersecting a first direction in which the core extends.

DESCRIPTION OF EXEMPLARY EMBODIMENTS

Figure 1:
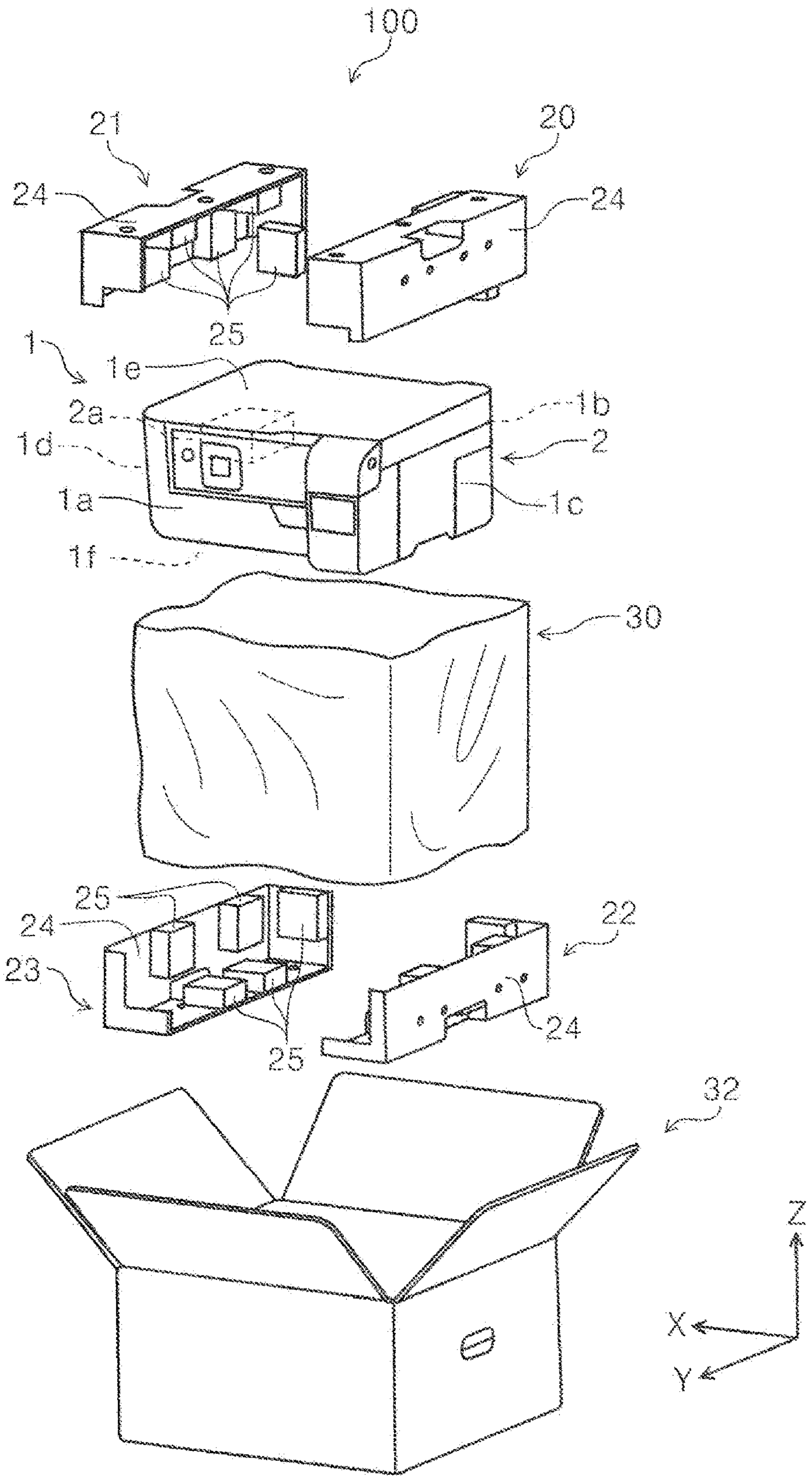
FIG. 1 is a diagram illustrating a configuration of a packing structure, and is a diagram illustrating a state where each configuration is removed from a packing box.

First, the present disclosure will be schematically described.

An electronic device according to a first aspect is an electronic device including ribs provided on an outer surface of a device main body, the ribs coming into contact with a packing material having cores via an accommodation bag, in which the ribs extend in a direction intersecting a first direction in which the cores extend.

According to the present aspect, in a structure in which the ribs come into contact with the packing material having the cores through the accommodation bag, since the ribs extend in a direction intersecting the first direction in which the cores extend, a contact area between the ribs and the cores increases, and thus it is possible to suppress tearing of the accommodation bag.

Note that the packing material may or may not have a core exposed on the surface thereof, and the packing material may be of either type in the present disclosure.

In a second aspect according to the first aspect, the electronic device further includes first ribs that are the ribs extending in a direction intersecting the first direction, and second ribs that are the ribs extending in a direction intersecting both the direction in which the first ribs extend and the first direction.

According to the present aspect, since the first ribs and the second ribs are provided, it is possible to further secure a contact area of the ribs with respect to the cores, and thus it is possible to suitably suppress tearing of the accommodation bag.

In a third aspect according to the second aspect, a plurality of the first ribs and a plurality of the second ribs are provided.

According to the present aspect, since the plurality of first ribs and second ribs are provided, it is possible to further secure a contact area of the ribs with respect to the cores, and thus it is possible to suitably suppress tearing of the accommodation bag.

In a fourth aspect according to the second or third aspect, each of the first ribs and the second ribs forms an angle of 45 degrees with respect to the first direction.

According to the present aspect, since the first rib and the second rib have an angle of 45 degrees with respect to the first direction, the angles of the first rib and the second rib with respect to the core can be constant without depending on the orientation of the packing material, and thus it is possible to obtain operational effects of the above-described second or third aspect regardless of the orientation of the packing material.

In a fifth aspect according to the fourth aspect, a portion where the first rib and the second rib intersect is formed in a round shape.

According to this aspect, the portion where the first rib and the second rib intersect is formed in a round shape, and thus it is possible to suitably suppress damage to the accommodation bag.

In a sixth aspect according to the first aspect, a plurality of the ribs are provided at intervals, and two adjacent ribs are coupled to each other by a coupling portion having a protrusion height lower than that of the ribs.

When the accommodation bag has a surplus portion, a folded portion may be formed. In addition, when the folded portion is sandwiched between the rib and the core, the folded portion is likely to be torn. According to the present aspect, since the plurality of ribs are provided at intervals, and the two adjacent ribs are coupled to each other by a coupling portion having a protrusion height lower than that of the ribs, the surplus portion of the accommodation bag may enter between the two adjacent ribs. Thereby, it is possible to suppress tearing of the accommodation bag caused by the folded portion being sandwiched between the rib and the core.

Further, it is possible to improve the strength of the device main body by the coupling portion.

In a seventh aspect according to any of the first to sixth aspects, the ribs are provided on a bottom surface of the device main body.

According to the present aspect, in a configuration in which the ribs are provided on the bottom surface of the device main body, the accommodation bag is likely to be torn due to the weight of the device main body, but it is possible to suppress tearing of the accommodation bag by operational effects of the above-described first aspect.

In an eighth aspect according to any one of the first to seventh aspects, the device main body includes a recording unit that performs recording on a medium.

According to the present aspect, in a configuration in which the device main body includes the recording unit that performs recording on the medium, operational effects of any one of the above-described first to seventh aspects can be obtained.

A packing structure according to a ninth aspect is a packing structure including an electronic device including a device main body, an accommodation bag accommodating the device main body, a shock absorbing member coming into contact with ribs formed at a bottom surface of the device main body via the accommodation bag, and a packing box accommodating the device main body via the accommodation bag and the shock absorbing member, in which the shock absorbing member is corrugated cardboard having cores extending in parallel with one side of a bottom surface of the packing box, and the ribs extend in a direction intersecting a first direction in which the cores extend.

According to the present aspect, in a structure in which the ribs come into contact with the shock absorbing member having the cores via the accommodation bag, the ribs extend in a direction intersecting the first direction in which the cores extend, and thus a contact area between the ribs and the cores increases, thereby making it possible to suppress tearing of the accommodation bag.

Note that the shock absorbing member may or may not have a core exposed on the surface thereof, and the shock absorbing member may be of either type in the present disclosure.

Details of the present disclosure will be described below.

In FIG. 1, a packing structure 100 includes an inkjet printer 1, which is an example of an electronic device, and various packing materials for packing the inkjet printer 1. In a packing box 32, the inkjet printer 1 and the packing materials except for the packing box 32 are accommodated, thereby configuring the packing structure 100. Note that FIG. 1 illustrates a state where the packing structure 100 is disassembled for convenience of description.

Note that an X-Y-Z coordinate system illustrated in each of the drawings is an orthogonal coordinate system, in which an X-axis direction is a device width direction, a Y-axis direction is a device depth direction, and a Z-axis direction is a device height direction, that is, a vertical direction in terms of the inkjet printer 1.

The inkjet printer 1 includes an inkjet recording head 2*a*, which is an example of a recording unit inside a device main body 2, and performs recording on recording paper by the inkjet recording head 2*a*.

An outer surface of the device main body 2 is constituted by six surfaces, that is, a front surface 1*a* which is a surface in a +Y direction, a back surface 1*b* which is a surface in a −Y direction, a right surface 1*c* which is a surface in a −X direction, a left surface 1*d* which is a surface in a +X direction, a top surface 1*e* which is a surface in a +Z direction, and a bottom surface 1*f* which is a surface in a −Z direction.

The packing box 32 is a corrugated cardboard box as an example and is configured such that an upper portion thereof can be opened and closed. The six surfaces of the packing box 32 are formed by any one of an X-Y plane, an X-Z plane, and a Y-Z plane.

First, the packing box 32 accommodates a lower right shock absorbing body 22 and a lower left shock absorbing body 23. The lower right shock absorbing body 22 is disposed in the −X direction with respect to the bottom of the device main body 2 of the inkjet printer 1, and the lower left shock absorbing body 23 is disposed in the +X direction with respect to the bottom of the device main body 2. The device main body 2 accommodated in the packing box 32 is supported from below by the lower right shock absorbing body 22 and the lower left shock absorbing body 23, and gaps in the right-left direction and the front-back direction inside the packing box 32 (gaps between the device main body 2 and the inner surface of the packing box 32) are filled.

The bases of both the lower right shock absorbing body 22 and the lower left shock absorbing body 23 are formed by corrugated cardboard 24, and a shock absorbing member 25 is attached to a surface facing the device main body 2.

Although details will be described later, the shock absorbing member 25 is a cardboard block in the present example.

The device main body 2 of the inkjet printer 1 is accommodated in an accommodation bag 30, and is accommodated in the packing box 32 in a state where the device main body 2 is covered with the accommodation bag 30. The accommodation bag 30 is a transparent or translucent bag formed of polyethylene, polypropylene, or the like as an example, and protects the device main body 2 from dust, moisture, or the like.

An upper right shock absorbing body 20 and an upper left shock absorbing body 21 are disposed at an upper portion of the device main body 2 covered with the accommodation bag 30. The upper right shock absorbing body 20 is disposed in the −X direction with respect to the upper portion of the device main body 2, and the upper left shock absorbing body 21 is disposed in the +X direction with respect to the upper portion of the device main body 2. In the device main body 2 accommodated in the packing box 32, an upper space inside the packing box 32 is filled by the upper right shock absorbing body 20 and the upper left shock absorbing body 21, and further, a gap between the right-left direction and the front-back direction (a gap between the device main body 2 and the inner surface of the packing box 32) is filled.

Similarly to the lower right shock absorbing body 22 and the lower left shock absorbing body 23 described above, the bases of both the upper right shock absorbing body 20 and the upper left shock absorbing body 21 are formed by the corrugated cardboard 24, and the shock absorbing member 25, which is an example of a packing material, is attached to a surface facing the device main body 2. Although details will be described later, the shock absorbing member 25 is a cardboard block in the present example.

Figure 2:
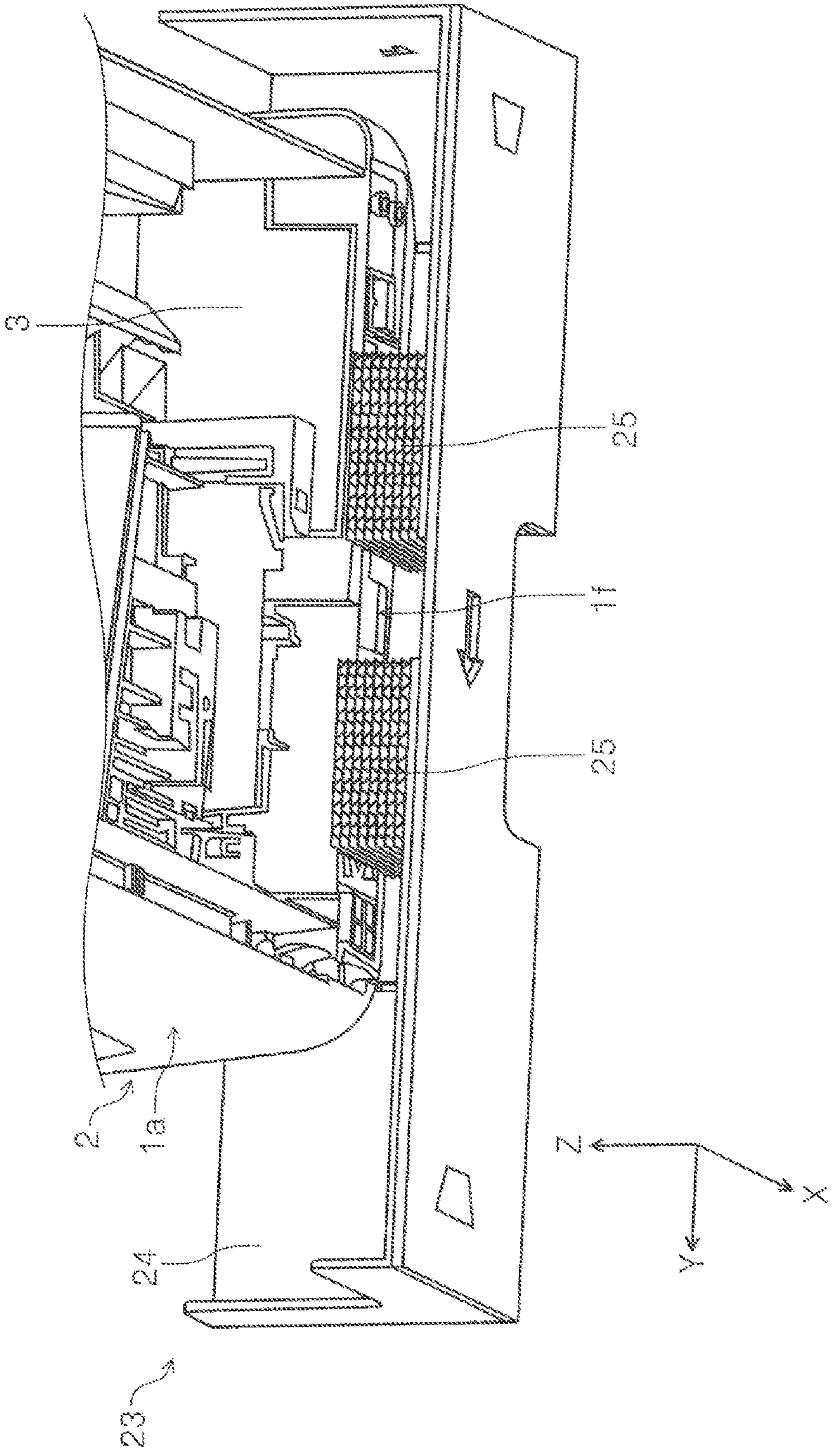
FIG. 2 is a diagram illustrating a state where a lower left shock absorbing body is disposed on a bottom surface of a printer.

FIG. 2 illustrates a state where the lower left shock absorbing body 23 is disposed on a bottom surface 1*f* of the device main body 2, and the two shock absorbing members 25 provided in the lower left shock absorbing body 23 are configured to support the bottom of the device main body 2 in the +X direction as illustrated in the drawing. Note that, in FIG. 2, the accommodation bag 30 is not illustrated. In addition, although not illustrated in the drawing, the two shock absorbing members 25 are configured to support the bottom of the device main body 2 in the −X direction also in the lower right shock absorbing body 22 that supports the bottom of the device main body 2 in the −X direction.

Figure 3A:
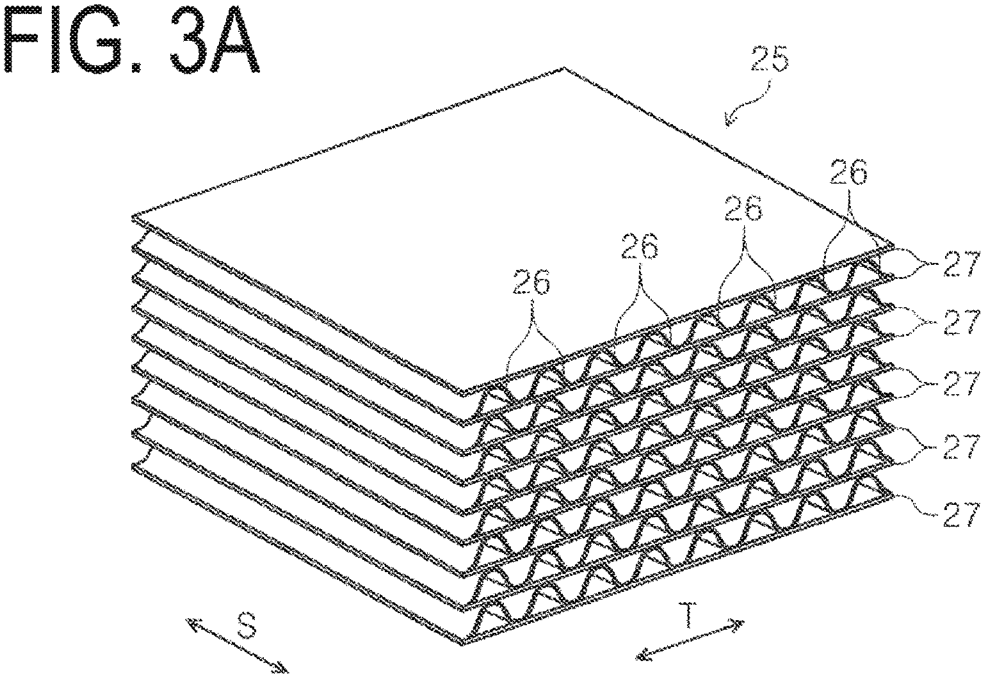
FIGS. 3A and 3B are perspective views of a shock absorbing member.

As illustrated in FIG. 3A, the shock absorbing member 25 is a corrugated cardboard block in the present embodiment and is configured such that a sheet material 27 and cores 26 are alternately laminated on each other. The cores 26 extend in a first direction indicated by sign S and is aligned along a second direction T that intersects the first direction S.

Note that the shock absorbing member 25 illustrated in FIG. 3A is configured such that an upper surface thereof in the drawing faces the device main body 2, that is, the sheet material 27 faces the outer surface of the device main body 2.

Figure 3B:
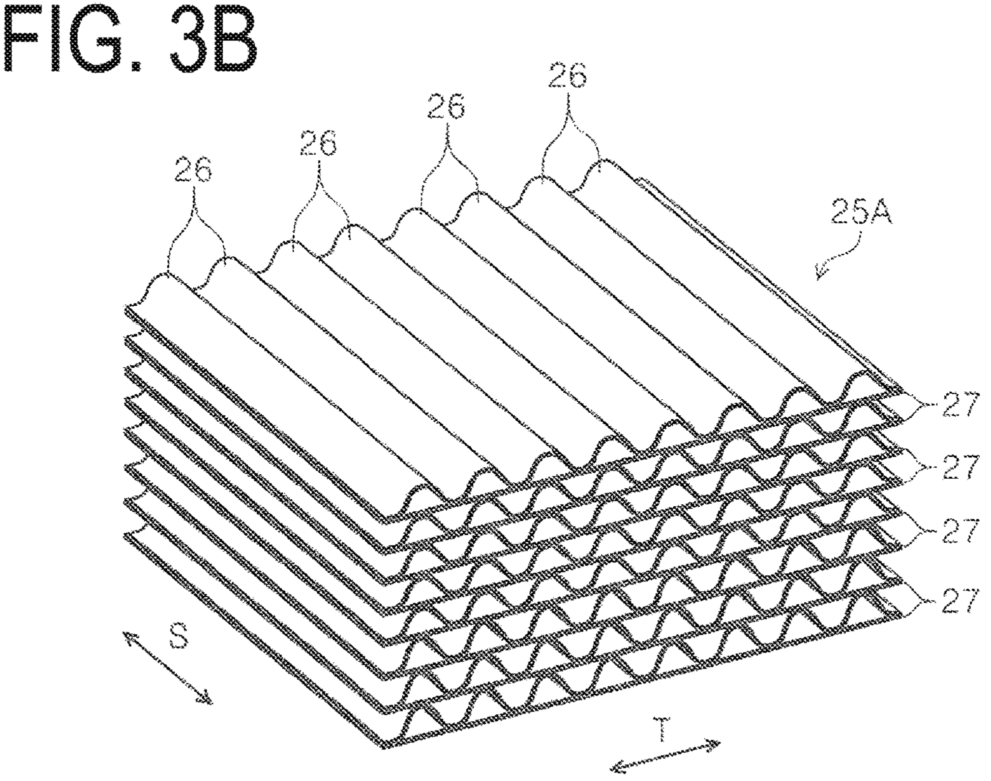

On the other hand, a shock absorbing member 25A illustrated in FIG. 3B is also configured such that an upper surface thereof in the drawing faces the device main body 2, and the exposed cores 26 face the outer surface of the device main body 2. As the shock absorbing member 25, either the form illustrated in FIG. 3A or the form illustrated in FIG. 3B may be used.

Figure 4:
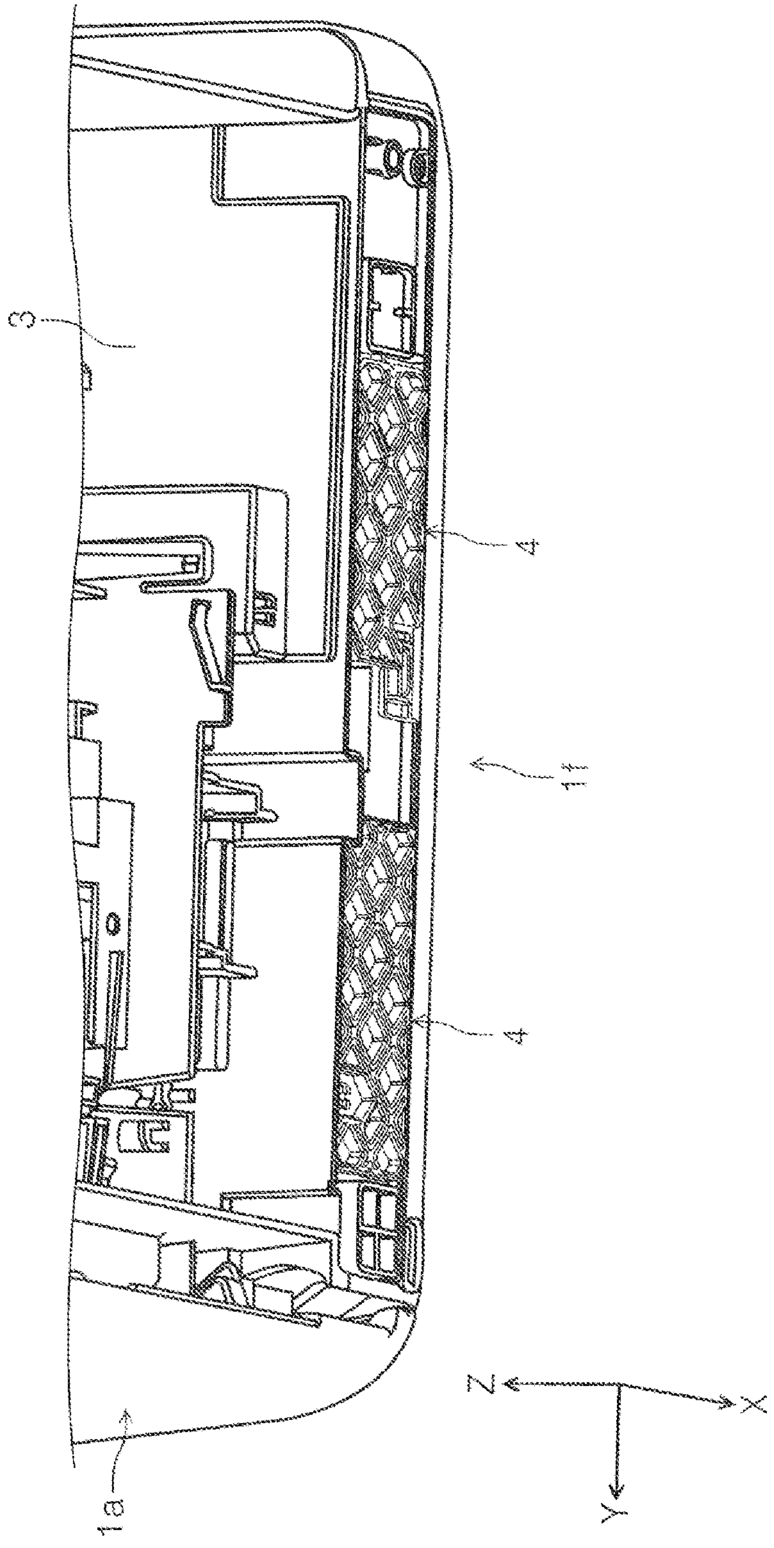
FIG. 4 is a perspective view of a shock absorbing member receiving portion provided on the bottom surface of the printer.

Next, FIG. 4 illustrates a state where the lower left shock absorbing body 23 is removed from FIG. 2, and a shock absorbing member receiving portion 4 is configured at a position where the two shock absorbing members 25 constituting the lower left shock absorbing body 23 come into contact as illustrated in the drawing. Note that, although not illustrated in the drawing, the shock absorbing member receiving portion 4 is similarly configured on a side (the bottom in the −X direction) where the lower right shock absorbing body 22 is disposed. The shock absorbing member receiving portion 4 is formed in a bottom frame 3 that constitutes a portion of the base of the device main body 2. The bottom frame 3 is formed of a resin material as an example in the present embodiment.

Figure 5:
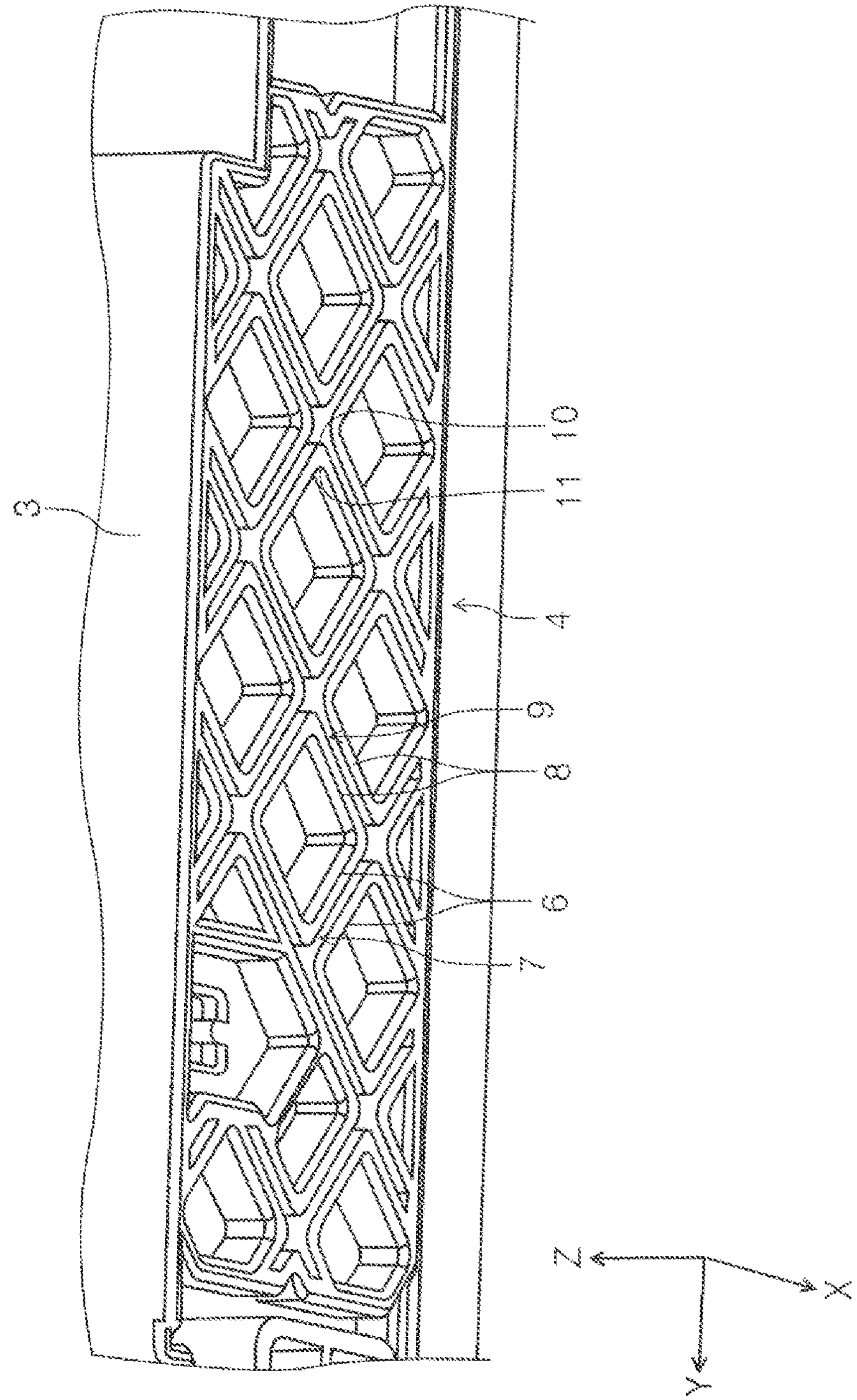
FIG. 5 is an enlarged perspective view of the shock absorbing member receiving portion provided on the bottom surface of the printer.

As illustrated in detail in FIG. 5, the shock absorbing member receiving portion 4 is constituted by first ribs 6 and second ribs 8. The first rib 6 intersects two directions, that is, the X-axis direction and the Y-axis direction, and specifically has an angle of 45 degrees as an example with respect to the X-axis direction and the Y-axis direction. The second rib 8 similarly intersects two directions, that is, the X-axis direction and the Y-axis direction, and specifically has an angle of 45 degrees as an example with respect to the X-axis direction and the Y-axis direction.

In the present embodiment, the first ribs 6 are aligned with a groove 7 therebetween. The groove 7 is formed as a thinned part at the time of performing resin molding of the bottom frame 3. The second ribs 8 are similarly aligned with a groove 9 therebetween. The groove 9 is formed as a thinned part at the time of performing resin molding of the bottom frame 3. Note that either one or both of the grooves 7 and 9 may be omitted without being formed. An inner cross-section 10, which is on the inner side of a position where the first rib 6 and the second rib 8 intersect, and an outer cross-section 11, which is on the outer side of a position where the first rib 6 and the second rib 8 intersect, are both formed in a round shape.

The first rib 6 and the second rib 8 have the same projection height in the −Z direction, that is, both the first rib 6 and the second rib 8 come into contact with the shock absorbing member 25 via the accommodation bag 30. In other words, the accommodation bag 30 is sandwiched between the first ribs 6, the second ribs 8, and the shock absorbing member 25.

Figure 6:
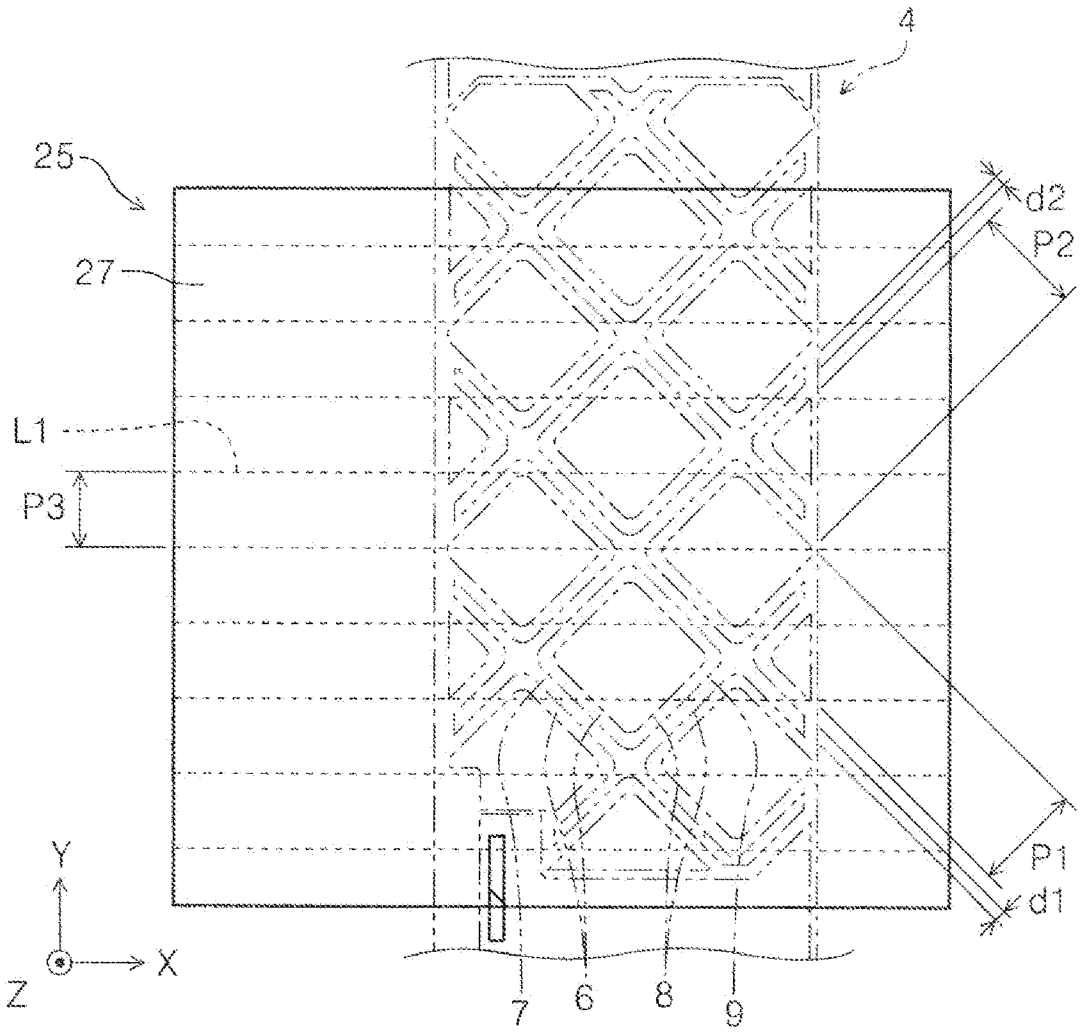
FIG. 6 is a diagram illustrating a positional relationship between cores of the shock absorbing member, first ribs, and second ribs.

FIG. 6 illustrates a positional relationship between the shock absorbing member 25 and the shock absorbing member receiving portion 4. A dashed line indicated by reference sign L1 in FIG. 6 indicates the top of the core 26, and FIG. 6 illustrates a state where a direction in which the cores 26 extend (a first direction S: see FIG. 3) is along the X-axis direction as an example. However, the direction in which the cores 26 extend may be along the Y-axis direction. That is, the cores 26 extend in parallel with one side of the bottom surface of the packing box 32 inside the packing box 32, and the direction thereof is the X-axis direction or the Y-axis direction.

Sign P3 in FIG. 6 indicates an arrangement interval between the cores 26.

Sign P1 indicates an arrangement interval between the first ribs 6, and sign d1 indicates the width of the groove 7. In addition, sign P2 indicates an arrangement interval between the second ribs 8, and sign d2 indicates the width of the groove 9.

In the present embodiment, the arrangement interval P1 between the first ribs 6 and the arrangement interval P2 between the second ribs 8 are equal to each other, and the width d1 of the groove 7 and the width d2 of the groove 9 are also equal to each other. However, the present disclosure is not limited thereto, and the arrangement interval P1 between the first ribs 6 and the arrangement interval P2 between the second ribs 8 may be different from each other, and the width d1 of the groove 7 and the width d2 of the groove 9 may also be different from each other.

Further, in the present embodiment, the arrangement interval P3 between the cores 26 is narrower than the arrangement interval P1 between the first ribs 6 and the arrangement interval P2 between the second ribs 8. The arrangement interval P3 between the cores 26 is wider than the width d1 of the groove 7 and the width d2 of the groove 9.

In this manner, the packing structure 100 includes an inkjet printer 1 including the device main body 2, the accommodation bag 30 that accommodates the device main body 2, the shock absorbing member 25 that comes into contact with the first ribs 6 and the second ribs 8 formed at the bottom surface 1*f* of the device main body 2 via the accommodation bag 30, and the packing box 32 that accommodates the device main body 2 via the accommodation bag 30 and the shock absorbing member 25. The shock absorbing member 25 is corrugated cardboard having the cores 26 extending in parallel with one side of the bottom surface of the packing box 32, and the first ribs 6 and the second ribs 8 extend in a direction intersecting the first direction S in which the cores 26 extend.

In addition, as described above, both the first ribs 6 and the second ribs 8 extend in a direction intersecting the first direction S in which the cores 26 extend. Thereby, a contact area between the first ribs 6 and the second ribs 8 with respect to the cores 26 increases, and it is possible to suppress tearing of the accommodation bag 30 sandwiched between the first ribs 6, the second ribs 8, and the shock absorbing member 25.

Note that, in the present embodiment, the cores 26 extend in parallel with one side of the bottom surface of the packing box 32 inside the packing box 32, and the direction thereof is the X-axis direction or the Y-axis direction. However, the present disclosure is not limited thereto, and it is only required that the first ribs 6 and the second ribs 8 extend in a direction intersecting the direction in which the cores 26 extend even when the cores 26 extend in other directions.

Further, in the present embodiment, the shock absorbing member receiving portion 4 includes the first ribs 6 and the second ribs 8. Thereby, it is possible to more secure a contact area of the ribs with respect to the cores 26 than in a configuration including only one of the first ribs 6 and the second ribs 8, and thus it is possible to suitably suppress tearing of the accommodation bag 30.

Note that the shock absorbing member receiving portion 4 may include only one of the first ribs 6 and the second ribs 8.

Further, in the present embodiment, since a plurality of first ribs 6 and a plurality of second ribs 8 are provided, it is possible to further secure a contact area of the ribs with respect to the cores 26, and thus it is possible to suitably suppress tearing of the accommodation bag 30.

Further, in the present embodiment, since the first rib 6 and the second rib 8 have an angle of 45 degrees with respect to the first direction S, the angles of the first rib 6 and the second rib 8 with respect to the core 26 can be constant without depending on the orientation of the shock absorbing member 25, and thus it is possible to suppress tearing of the accommodation bag 30 regardless of the orientation of the shock absorbing member 25. Note that the first rib 6 and the second rib 8 do not need to have an angle of 45 degrees with respect to the first direction S, and may be in a range of, for example, 40 degrees to 50 degrees.

Further, in the present embodiment, the parts where the first ribs 6 and the second ribs 8 intersect each other, that is, the inner cross-section 10 and the outer cross-section 11 described with reference to FIG. 5 are formed in a round shape. Thereby, it is possible to suitably suppress tearing of the accommodation bag 30.

Figure 7:
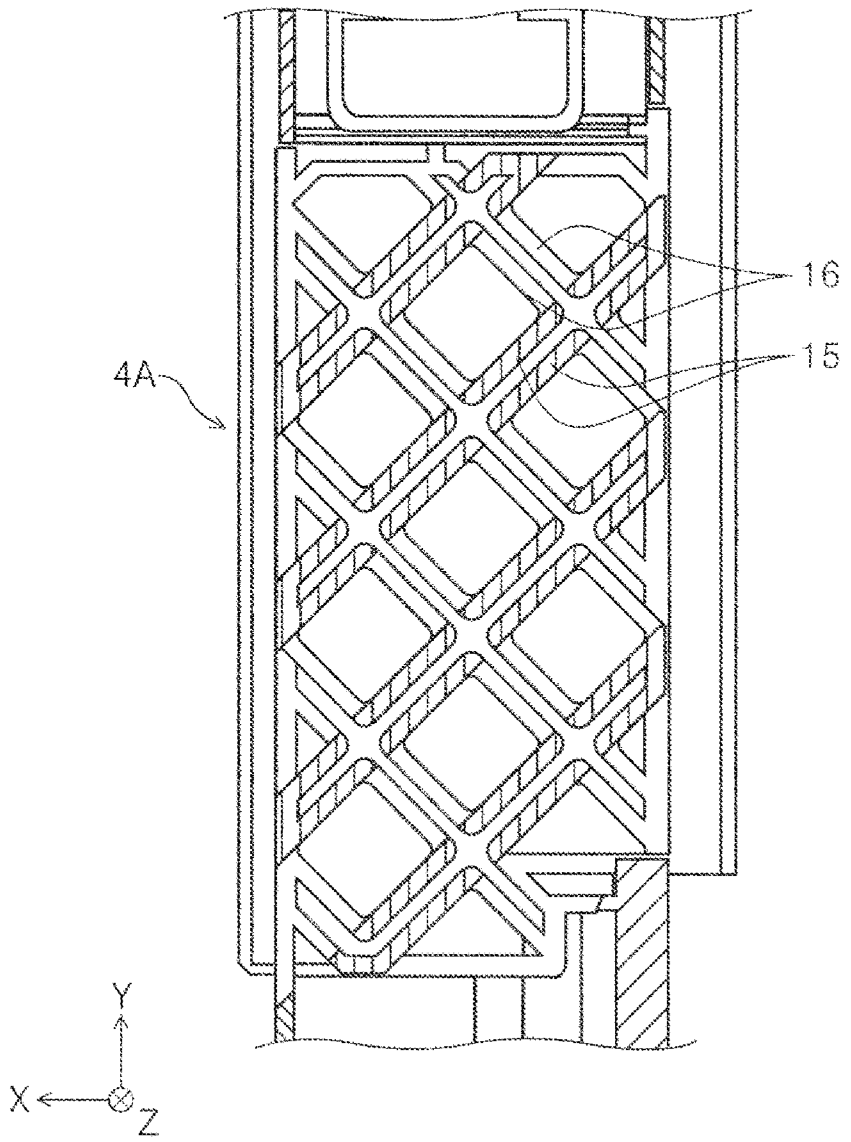
FIG. 7 illustrates a plan view of a shock absorbing member receiving portion according to another embodiment.

Note that the shock absorbing member receiving portion 4 may be modified like a shock absorbing member receiving portion 4A illustrated in FIG. 7. The shock absorbing member receiving portion 4A illustrated in FIG. 7 includes first ribs 15. The first rib 15 is a rib similar to the first rib 6 described above, and a plurality of first ribs 15 are provided at intervals. In FIG. 7, the first ribs 15 are hatched, and the first ribs 15 come into contact with the shock absorbing member 25 via the accommodation bag 30.

Figure 8:
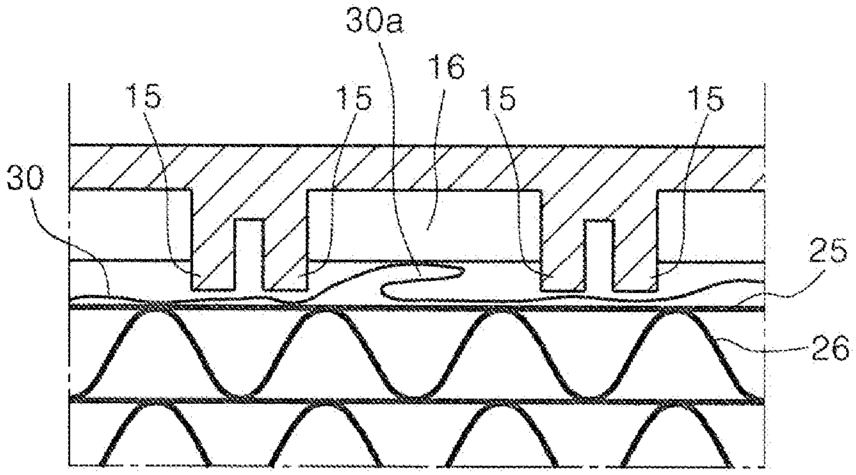
FIG. 8 is a cross-sectional view of the shock absorbing member receiving portion according to the other embodiment.

Adjacent first ribs 15 are coupled to each other by coupling portions 16. As illustrated in FIG. 8, the coupling portion 16 is formed to have a height lower than the first rib 15, and is formed to such a height as not to sandwich the accommodation bag 30 together with the shock absorbing member 25. With such a configuration, the following operational effects are obtained.

That is, when the accommodation bag 30 has a surplus portion, a folded portion 30*a* may be formed, and when the folded portion 30*a* is sandwiched between the first rib 15 and the core 26, the folded portion 30*a* is likely to be torn. However, since the plurality of first ribs 15 are provided at intervals, and two adjacent first ribs 15 are coupled to each other by a coupling portion 16 having a lower protrusion height than that of the first rib 15, the surplus portion of the accommodation bag 30 can enter between the two adjacent first ribs 15. Thereby, it is possible to suppress tearing of the accommodation bag 30 due to the folded portion 30*a* being sandwiched between the first rib 15 and the core 26.

In addition, it is possible to improve the strength of the device main body 2 by the coupling portion 16.

Note that, even in a configuration in which the coupling portion 16 is omitted, the surplus portion of the accommodation bag 30 enters between the two adjacent first ribs 15, which makes it possible to suppress tearing of the accommodation bag 30.

The embodiment described above is an example, and various modifications can be made. For example, in the embodiment described above, the shock absorbing member receiving portions 4 and 4A are formed at the bottom surface 1*f* of the device main body 2, but the shock absorbing member receiving portions 4 and 4A may be provided on one surface or a plurality of surfaces other than the bottom surface 1*f* among the six surfaces (the front surface 1*a*, the back surface 1*b*, the right surface 1*c*, the left surface 1*d*, the top surface 1*e*, the bottom surface 1*f*) constituting the outer surface of the device main body 2, or may be provided on a plurality of surfaces including the bottom surface 1*f*.

Further, in the embodiment described above, an electronic device as a packed object is an inkjet printer. However, the present disclosure is not limited thereto, and may be any of other electronic device.

Additionally, the shock absorbing member receiving portions 4 and 4A come into contact with the shock absorbing member 25 via the accommodation bag 30, but it is possible to suppress tearing of the accommodation bag 30 even when the shock absorbing member receiving portions 4 and 4A come into contact with the corrugated cardboard 24 constituting the lower right shock absorbing body 22 or the lower left shock absorbing body 23 in a configuration in which the shock absorbing member 25 is omitted. In this case, the corrugated cardboard 24 is a packing material.

Alternatively, even when the shock absorbing member receiving portions 4 and 4A are in contact with the inner bottom surface of the packing box 32 via the accommodation bag 30, tearing of the accommodation bag 30 can be suppressed. In this case, the packing box 32 is a packing material.

Further, in the present embodiment, all of the corrugated cardboard 24, the shock absorbing member 25, and the packing box 32 are made of paper, but may be formed of other materials such as plastic.

Further, the present disclosure is not limited to the above-described embodiment and modification examples, various modification can be made within the scope of the disclosure as described in the appended claims, and it is needless to say that the modifications also fall within the scope of the disclosure.

What is claimed is:

1. An electronic device, comprising a rib provided at an outer surface of a device main body, the rib being configured to come into contact, via an accommodation bag, with a packing material having a core, wherein the rib is configured to extend in a direction intersecting a first direction in which the core extends.

2. The electronic device according to claim 1, comprising:

a first rib being the rib configured to extend in a direction intersecting the first direction; and a second rib being the rib configured to extend in a direction intersecting both the direction in which the first rib extends and the first direction.

3. The electronic device according to claim 2, wherein a plurality of the first ribs and a plurality of the second ribs are provided.

4. The electronic device according to claim 2, wherein each of the plurality of first ribs and each of the plurality of second ribs form an angle of 45 degrees with respect to the first direction.

5. The electronic device according to claim 4, wherein a portion where the first rib and the second rib intersect is formed in a round shape.

6. The electronic device according to claim 1, wherein a plurality of the ribs are provided at intervals, and two adjacent ribs of the plurality of ribs are coupled by a coupling portion having a protrusion height lower than a protrusion height of the plurality of ribs.

7. The electronic device according to claim 1, wherein the plurality of ribs are provided at a bottom surface of the device main body.

8. The electronic device according to claim 1, wherein the device main body includes a recording unit that performs recording on a medium.

9. A packing structure, comprising:

an electronic device including a device main body;

an accommodation bag configured to accommodate the device main body;

a shock absorbing member configured to come into contact, via the accommodation bag, with a rib formed at a bottom surface of the device main body; and a packing box configured to accommodate the device main body via the accommodation bag and the shock absorbing member, wherein the shock absorbing member is corrugated cardboard having a core extending in parallel with one side of a bottom surface of the packing box, and the rib is configured to extend in a direction intersecting a first direction in which the core extends.

* * * * *